(12) United States Patent
Liu et al.

(10) Patent No.: US 11,144,108 B2
(45) Date of Patent: *Oct. 12, 2021

(54) OPTIMIZING POWER USAGE BY FACTORING PROCESSOR ARCHITECTURAL EVENTS TO PMU

(71) Applicant: Intel Corporation, Santa Clara, CA (US)

(72) Inventors: Yen-Cheng Liu, Portland, OR (US); P. Keong Or, Portland, OR (US); Krishnakanth V. Sistla, Beaverton, OR (US); Ganapati Srinivasa, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 39 days.

This patent is subject to a terminal disclaimer.

(21) Appl. No.: 15/281,587

(22) Filed: Sep. 30, 2016

(65) Prior Publication Data

US 2017/0017286 A1    Jan. 19, 2017

Related U.S. Application Data

(63) Continuation of application No. 14/972,765, filed on Dec. 17, 2015, now abandoned, which is a
(Continued)

(51) Int. Cl.
*G06F 1/32* (2019.01)
*G06F 1/20* (2006.01)
(Continued)

(52) U.S. Cl.
CPC ............ *G06F 1/3243* (2013.01); *G06F 1/206* (2013.01); *G06F 1/3203* (2013.01); *G06F 1/324* (2013.01);
(Continued)

(58) Field of Classification Search
None
See application file for complete search history.

(56) References Cited

U.S. PATENT DOCUMENTS

| 5,339,445 A | 8/1994 | Gasztonyi |
| 5,396,635 A | 3/1995 | Fung |

(Continued)

FOREIGN PATENT DOCUMENTS

| JP | 05197568 | 6/1993 |
| JP | 11161383 | 6/1999 |

(Continued)

OTHER PUBLICATIONS

UltraSPARC T1 Supplement to the UltraSPARC Architecture 2005, https://www.oracle.com/technetwork/systems/opensparc/t1-08-ust1-uasuppl-draft-p-ext-1537736.html, Draft D2.0, Mar. 17, 2006.*
(Continued)

*Primary Examiner* — Jaweed A Abbaszadeh
*Assistant Examiner* — Cheri L Harrington
(74) *Attorney, Agent, or Firm* — Nicholson De Vos Webster & Elliott LLP

(57) ABSTRACT

A method and apparatus to monitor architecture events is disclosed. The architecture events are linked together via a push bus mechanism with each architectural event having a designated time slot. There is at least one branch of the push bus in each core. Each branch of the push bus may monitor one core with all the architectural events. All the data collected from the events by the push bus is then sent to a power control unit.

14 Claims, 4 Drawing Sheets

Related U.S. Application Data continuation of application No. 14/598,454, filed on Jan. 16, 2015, now Pat. No. 9,367,112, which is a continuation of application No. 14/182,385, filed on Feb. 18, 2014, now Pat. No. 8,966,299, which is a continuation of application No. 13/787,085, filed on Mar. 6, 2013, now Pat. No. 8,700,933, which is a continuation of application No. 13/329,700, filed on Dec. 19, 2011, now Pat. No. 8,412,970, which is a continuation of application No. 11/618,477, filed on Dec. 29, 2006, now Pat. No. 8,117,478.

(51) Int. Cl.
| | |
|---|---|
| *G06F 15/80* | (2006.01) |
| *G06F 12/0811* | (2016.01) |
| *G11C 7/10* | (2006.01) |
| *G06F 1/3234* | (2019.01) |
| *G06F 1/3203* | (2019.01) |
| *G06F 1/3287* | (2019.01) |
| *G06F 1/324* | (2019.01) |
| *G06F 1/3206* | (2019.01) |

(52) U.S. Cl.
CPC .......... *G06F 1/3206* (2013.01); *G06F 1/3275* (2013.01); *G06F 1/3287* (2013.01); *G06F 12/0811* (2013.01); *G06F 15/80* (2013.01); *G11C 7/1072* (2013.01); *G11C 7/1075* (2013.01); *G06F 2212/283* (2013.01); *Y02D 10/00* (2018.01)

(56) References Cited

U.S. PATENT DOCUMENTS

| | | | |
|---|---|---|---|
| 5,761,200 A | 6/1998 | Hsieh | |
| 5,781,783 A * | 7/1998 | Gunther | G06F 1/3228 700/295 |
| 6,460,107 B1 * | 10/2002 | Rao | G06F 11/3409 710/305 |
| 6,633,943 B1 | 10/2003 | James et al. | |
| 6,725,282 B1 | 4/2004 | Grzybowski et al. | |
| 6,908,227 B2 | 6/2005 | Rusu et al. | |
| 7,062,304 B2 | 6/2006 | Chauvel et al. | |
| 7,146,511 B2 | 12/2006 | Barr et al. | |
| 7,174,194 B2 | 2/2007 | Chauvel et al. | |
| 7,197,655 B2 | 3/2007 | Flachs et al. | |
| 7,222,245 B2 | 5/2007 | Singh | |
| 7,272,732 B2 | 9/2007 | Farkas et al. | |
| 7,318,222 B2 | 1/2008 | Civlin | |
| 7,340,378 B1 | 3/2008 | Floyd et al. | |
| 7,454,316 B2 | 11/2008 | Bose et al. | |
| 7,516,334 B2 | 4/2009 | Suzuoki et al. | |
| 7,538,772 B1 * | 5/2009 | Fouladi | G06F 13/1605 345/531 |
| 7,598,702 B2 | 10/2009 | Walrath | |
| 7,627,784 B1 | 12/2009 | Allen et al. | |
| 7,770,034 B2 | 8/2010 | Nanja | |
| 7,788,670 B2 | 8/2010 | Bodas et al. | |
| 8,473,766 B2 | 6/2013 | Liu et al. | |
| 2003/0018860 A1 * | 1/2003 | Krueger | G06F 12/109 711/152 |
| 2003/0093727 A1 | 5/2003 | Belschner | |
| 2003/0158609 A1 | 6/2003 | Chiu | |
| 2003/0125900 A1 * | 7/2003 | Orenstien | G06F 1/3203 702/132 |
| 2003/0126478 A1 | 7/2003 | Burns et al. | |
| 2003/0126479 A1 | 7/2003 | Burns et al. | |
| 2003/0217297 A1 | 11/2003 | Gschwind et al. | |
| 2004/0117677 A1 * | 6/2004 | Jahagirdar | G06F 1/206 713/320 |
| 2004/0163000 A1 | 8/2004 | Kuhlmann et al. | |
| 2004/0210787 A1 | 10/2004 | Cox et al. | |
| 2004/0268164 A1 | 12/2004 | Flachs et al. | |
| 2004/0268166 A1 | 12/2004 | Farkas et al. | |
| 2005/0010908 A1 * | 1/2005 | Funk | G06F 11/3648 717/124 |
| 2005/0076251 A1 | 4/2005 | Barr et al. | |
| 2005/0120254 A1 | 6/2005 | Suzuoki et al. | |
| 2005/0125701 A1 | 6/2005 | Hensbergen et al. | |
| 2005/0125702 A1 * | 6/2005 | Huang | G06F 1/329 713/320 |
| 2005/0132238 A1 | 6/2005 | Nanja | |
| 2005/0183065 A1 * | 8/2005 | Wolczko | G06F 9/3851 717/124 |
| 2005/0235134 A1 | 10/2005 | O'Sullivan et al. | |
| 2005/0257078 A1 | 11/2005 | Bose et al. | |
| 2005/0283669 A1 | 12/2005 | Adkisson et al. | |
| 2005/0283677 A1 | 12/2005 | Adkisson et al. | |
| 2005/0289362 A1 | 12/2005 | Merkin et al. | |
| 2006/0080062 A1 | 4/2006 | Bose et al. | |
| 2006/0095904 A1 * | 5/2006 | Gardner | G06F 9/45533 718/1 |
| 2006/0221980 A1 | 10/2006 | Bose et al. | |
| 2006/0244483 A1 | 11/2006 | Berry, II | |
| 2007/0033425 A1 | 2/2007 | Clark | |
| 2007/0079294 A1 | 4/2007 | Knight et al. | |
| 2007/0083779 A1 | 4/2007 | Misaka | |
| 2007/0094444 A1 | 4/2007 | Sutardja | |
| 2007/0168807 A1 | 7/2007 | Adkisson | |
| 2007/0180280 A1 | 8/2007 | Bolan et al. | |
| 2007/0192641 A1 | 8/2007 | Nagendra et al. | |
| 2007/0198863 A1 | 8/2007 | Bose et al. | |
| 2007/0204137 A1 | 8/2007 | Tran | |
| 2007/0294054 A1 | 12/2007 | Mericas | |
| 2008/0072110 A1 | 3/2008 | Adkisson et al. | |
| 2008/0082844 A1 | 4/2008 | Ghiasi et al. | |
| 2008/0301474 A1 | 12/2008 | Bussa et al. | |

FOREIGN PATENT DOCUMENTS

| | | |
|---|---|---|
| JP | 2000315160 A | 11/2000 |
| JP | 2001229040 | 8/2001 |
| JP | 2002221958 A | 8/2002 |
| JP | 2002342125 A | 11/2002 |
| JP | 2005135379 A | 5/2005 |
| JP | 2005527875 | 9/2005 |
| JP | 2005352672 A | 12/2005 |
| JP | 2006351032 A | 12/2006 |
| WO | WO2006037119 | 4/2006 |

OTHER PUBLICATIONS

Final Office Action from U.S. Appl. No. 11/618,477 dated Jan. 5, 2010, 4 pages.
Final Office Action from U.S. Appl. No. 11/618,477 dated Mar. 31, 2011, 7 pages.
Final Office Action from U.S. Appl. No. 14/598,454 dated Oct. 22, 2015, 13 pages.
Final Office Action from U.S. Appl. No. 14/972,765, dated Feb. 10, 2017, 10 pages.
Non-Final Office Action from U.S. Appl. No. 11/618,477 dated Aug. 5, 2010, 7 pages.
Non-Final Office Action from U.S. Appl. No. 11/618,477 dated Jun. 5, 2009, 16 pages.
Non-Final Office Action from U.S. Appl. No. 13/329,700 dated Jun. 15, 2012, 17 pages.
Non-Final Office Action from U.S. Appl. No. 13/787,085 dated Jul. 16, 2013, 16 pages.
Non-Final Office Action from U.S. Appl. No. 14/598,454 dated May 12, 2015, 29 pages.
Non-Final Office Action from U.S. Appl. No. 14/972,765 dated Oct. 7, 2016, 12 pages.
Notice of Allowance from U.S. Appl. No. 11/618,477 dated Oct. 4, 2011, 10 pages.
Notice of Allowance from U.S. Appl. No. 13/329,700 dated Dec. 12, 2012, 8 pages.
Notice of Allowance from U.S. Appl. No. 13/609,006 dated Feb. 25, 2013, 15 pages.

(56) References Cited

OTHER PUBLICATIONS

Notice of Allowance from U.S. Appl. No. 13/787,085 dated Nov. 18, 2013, 23 pages.
Notice of Allowance from U.S. Appl. No. 14/182,385 dated Oct. 17, 2014, 24 pages.
Notice of Allowance from U.S. Appl. No. 14/598,454 dated Feb. 10, 2016, 7 pages.
Japanese Patent Office, Japan, Office Action dated Sep. 4, 2012 in Japanese application No. 2011-138138.
Japanese Patent Office, Office Action dated Jun. 23, 2013 in Japanese application No. 2011-138138.
Final Office Action for U.S. Appl. No. 14/972,765, dated Jun. 9, 2017, 20 pages.
Final Office Action from U.S. Appl. No. 14/972,765, dated Nov. 16, 2017, 13 pages.
Non-Final Office Action from U.S. Appl. No. 14/972,765, dated Mar. 28, 2018, 11 pages.
Non-Final Office Action from U.S. Appl. No. 15/281,506, dated Feb. 27, 2018, 25 pages.
Final Office Action from U.S. Appl. No. 14/972,765, dated Aug. 30, 2018, 22 pages.
Final Office Action from U.S. Appl. No. 15/281,506, dated Jul. 19, 2018, 16 pages.
Non-Final Office Action from U.S. Appl. No. 15/281,506, dated Nov. 15, 2018, 21 pages.
Contreras G., et al., "Power Prediction for Intel XScale Processors Using Performance Monitoring Unit Events," Low Power Electronics and Design, ISLPED'05, Proceedings of International Symposium on Aug. 8-10, 2005, pp. 221-226.
Decision of Refusal from foreign counterpart Japanese Patent Application No. 2007-334354, dated Feb. 22, 2011, 3 pages.
First Office Action from foreign counterpart Chinese Patent Application No. 200710307364.4, dated Aug. 21, 2009, 10 pages.
First Office Action from foreign counterpart Chinese Patent Application No. 201110118736.5, dated Feb. 14, 2012, 11 pages.
Notice on Grant of Patent Right for Invention from foreign counterpart Chinese Patent Application No. 201110118736.5, dated Apr. 22, 2013, 6 pages.
Notice on Grant of Patent Right for Invention from foreign counterpart Chinese Application No. 200710307364.4, dated Feb. 12, 2011, 4 pages.
Office Action from foreign counterpart Japanese Patent Application No. 2007-334354, dated Apr. 13, 2010, 4 pages.
Office Action from foreign counterpart Japanese Patent Application No. 2007-334354, dated Nov. 2, 2010, 5 pages.
Second Office Action from foreign counterpart Chinese Patent Application No. 200710307364.4, dated Apr. 13, 2010, 8 pages.
Second Office Action from foreign counterpart Chinese Patent Application No. 201110118736.5, dated Oct. 18, 2012, 7 pages.
Decision of Refusal for foreign counterpart Japan Application No. 2011-138138, dated Jul. 17, 2013, 4 pages.
Notification of Reasons for Refusal for foreign counterpart Japan Application No. 2011-138138, dated Aug. 30, 2012, 8 pages.
Final Office Action from U.S. Appl. No. 15/281,506, dated Mar. 19, 2019, 20 pages.

* cited by examiner

OPTIMIZING POWER USAGE BY FACTORING PROCESSOR ARCHITECTURAL EVENTS TO PMU

CROSS REFERENCE TO RELATED APPLICATION

This application is a continuation of U.S. patent application Ser. No. 14/972,765, filed Dec. 17, 2015, which is a continuation of U.S. patent application Ser. No. 14/598,454, filed Jan. 16, 2015, which is a continuation of U.S. patent application Ser. No. 14/182,385, filed Feb. 18, 2014, now U.S. Pat. No. 8,966,299, Issued on Feb. 24, 2015, which is a continuation of U.S. patent application Ser. No. 13/787,085, filed Mar. 6, 2013, now U.S. Pat. No. 8,700,933, Issued on Apr. 15, 2014, which is a continuation of U.S. patent application Ser. No. 13/329,700, filed Dec. 19, 2011, now U.S. Pat. No. 8,412,970, Issued on Apr. 2, 2013, which is a continuation of U.S. patent application Ser. No. 11/618,477, filed Dec. 29, 2006, now U.S. Pat. No. 8,117,478, Issued on Feb. 14, 2012, all of which is herein incorporated by reference.

BACKGROUND INFORMATION

Processor power consumption has become a major issue in recent years. The current trend of processor design to multi-core architecture as eased the pressure on power consumption. However, power consumption still grows linearly with the number of cores being designed.

Recent developments in technology have provided new opportunities to further optimize power consumptions. However, these technologies still have several downsides. Specifically, within the new technologies, OS does not understand how effectively the workload is running in the hardware and the associated power cost in the hardware. Secondly, OS interaction is very slow to react. Thirdly, the current OS do not control performance power state per core. Finally, turbo mode only takes thermal and sensor feedback, it does take into account the cores higher performance requirement.

BRIEF DESCRIPTION OF THE DRAWINGS

Various features of the invention will be apparent from the following description of preferred embodiments as illustrated in the accompanying drawings, in which like reference numerals generally refer to the same parts throughout the drawings. The drawings are not necessarily to scale, the emphasis instead being placed upon illustrating the principles of the inventions.

DETAILED DESCRIPTION

Figure 1:
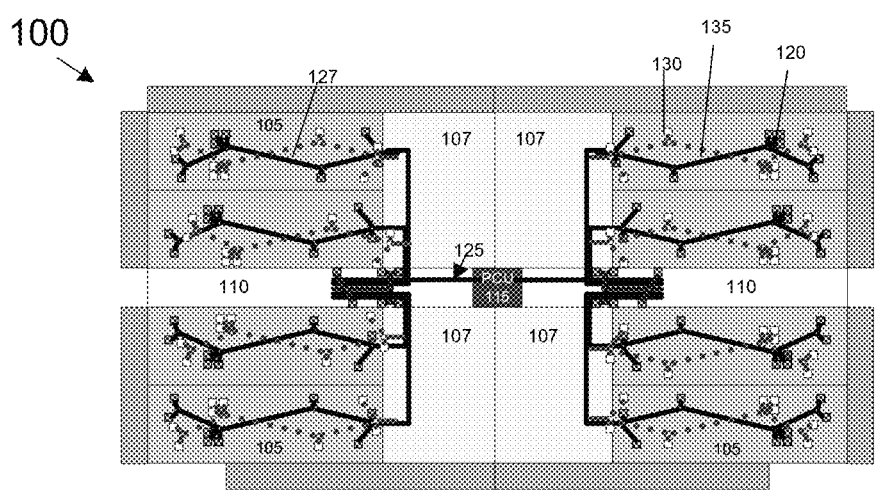
FIG. 1 illustrates a diagram of a thermal sensor and architecture events connection to a PCU in accordance with one embodiment of the invention.

In the following description, for purposes of explanation and not limitation, specific details are set forth such as particular structures, architectures, interfaces, techniques, etc. in order to provide a thorough understanding of the various aspects of the invention. However, it will be apparent to those skilled in the art having the benefit of the present disclosure that the various aspects of the invention may be practiced in other examples that depart from these specific details. In certain instances, descriptions of well-known devices, circuits, and methods are omitted so as not to obscure the description of the present invention with unnecessary detail.

Some of the embodiments discussed herein may be utilized to perform event handling operations. In an embodiment, an "event" refers to a condition that may or may not require some action to be taken by logic. Furthermore, events may be classified into different types based on the action that is to be taken.

In one embodiment, and "architectural event" refers to an event or condition that may be monitored (e.g., by programming information corresponding to the architectural event into a state). In an embodiment, software may configure a channel to monitor certain architectural event which may not otherwise be observable by software and/or hardware. In an embodiment, an architectural event may generally refer to an event or condition that occurs within processing resources or other logic present on the same integrated circuit chip as a processor.

In an embodiment, architecture events are one factor for making power management decisions. Architecture events are widely used for software performance optimization. By factoring in architecture events for making power management decisions, the embodiment may effectively detect core execution condition that neither OS nor turbo mode can currently detect.

One embodiment provides additional value to a power control unit (PCU) to make appropriate power decisions using existing designs. The PCU handles thermal events, schedules/manages per core's frequency increase/decrease. In the embodiment, logic is added in the PCU. The PCU then takes feedback from counters to assist in making decisions to scale up a particular core.

Architecture events inside a processor are usually detected by a series of physical counters implemented in different areas of the processor. These counters maybe referred to as EMON counters. EMON counters are performance monitoring counters that reside in each function unit that counts the number of specific events that has occurred during a period of time.

There may be public EMON counters and private EMON counters. Public EMON counters are those accessible by vendors and users, while private EMON counters are used internally for debugging. Both public and private EMON counters may be used for software and hardware tuning. EMON counters are very useful tools to understand the application behavior and how effective the current application is doing inside the processor.

Instruction retried is one type of EMON counter. By knowing instruction retired per cycle, the system knows how fast the current application is executing inside the processor. More instruction retired per cycle, the better performance the application is getting.

Another type EMON counter is a MLC/LLC cache miss. Programs experience lots of MLC/LLC cache miss usually means they require higher BW to system interconnect. It also means the program will not be effectively executing instruction since most of time the problem will be stalled waiting for data return.

Branch Misprediction is also a type of EMON counter. This is a good indicator to show that the core is not doing lots of "useful" work since it is working on the wrong branch of instruction stream.

TLB miss is also a type of EMON counter. Similar to MLC/LLC miss, a TLB miss usually means stalling the core until data has returned.

There are many more counters defined in any processor. For example, Intel's P4 processor contains more than 200 counters. Some of the counters are for performance tuning while others are for debug/validation purposes. The four counters mentioned above, instruction retired, MLC/LLC cache miss, branch misprediction and TLB miss are crucial to the power management discussed here within.

However, it should be noted that the present disclosure is not limited to the above identified counters. Rather, the present disclosure may take as many architectural events as needed. The present system utilizes a push bus mechanism that can connect all counters serially on the same bus since these counters do not require high bandwidth or high refresh rate.

FIG. 1 illustrates a diagram of a thermal sensor and architecture events connection 100 to a PCU in accordance with one embodiment of the invention. FIG. 1 illustrates a processor with eight cores 105 and four shared last level caches (LLC) 107. It should be noted that the eight cores and four shared LLCs are shown for illustrative purposes only. Any number of cores or LLCs may be used for this embodiment. A functional unit 110 is shared among the cores 105. The PCU 115 is one of the units to be shared by the cores 105.

The dark squares in the cores 105 represent thermal sensors 120. The cores 105 have thermal sensors 120 to prevent over heating of the cores 105. A serial push bus 125 connects all the sensors 120 on the bus. The push bus 125 may have various branches. A first branch 127 of the push bus 125 may take up to 96 time slots, where each time slot is reserved for one of the thermal sensors 120. There is at least one branch 127 of the push bus 125 in each core 105. Each branch 127 of the push bus 105 may monitor one core 105 with all the thermal sensors 120. All the data collected from the thermal sensors 120 by the push bus 125 is then sent to the PCU 115.

A similar approach is made to monitor architectural events by linking different counters via the same serial push bus mechanism and each counter having a designated time slot. The light squares are EMON counters 130. The dotted line 135 is another branch of the serial push bus. The second branch 135 of the push bus 125 may take up to 96 time slots, where each time slot is reserved for one of the EMON counters. There is at least one branch 135 of the push bus 125 in each core 105. Each branch 135 of the push bus 125 may monitor one core 105 with all the EMON counters 130. All the data collected from the EMON counters 130 by the push bus 125 is then sent to the PCU 115.

The PCU 115 may have very low sampling rate to retrieve information from the push bus 125 which is one reason why all the sensors may share a narrow bus. The serial push bus 125 may not be more than 10 bits wide and runs a low sampling rate. Due to this, there is no high bandwidth requirement to monitor these events. Sampling the counters every 1000 cycles may be sufficient. The sampling frequency should be tuned with the thermal sensors so that PCU 115 decisions may be made coherent between architectural events 130 and thermal sensors 120.

Figure 2:
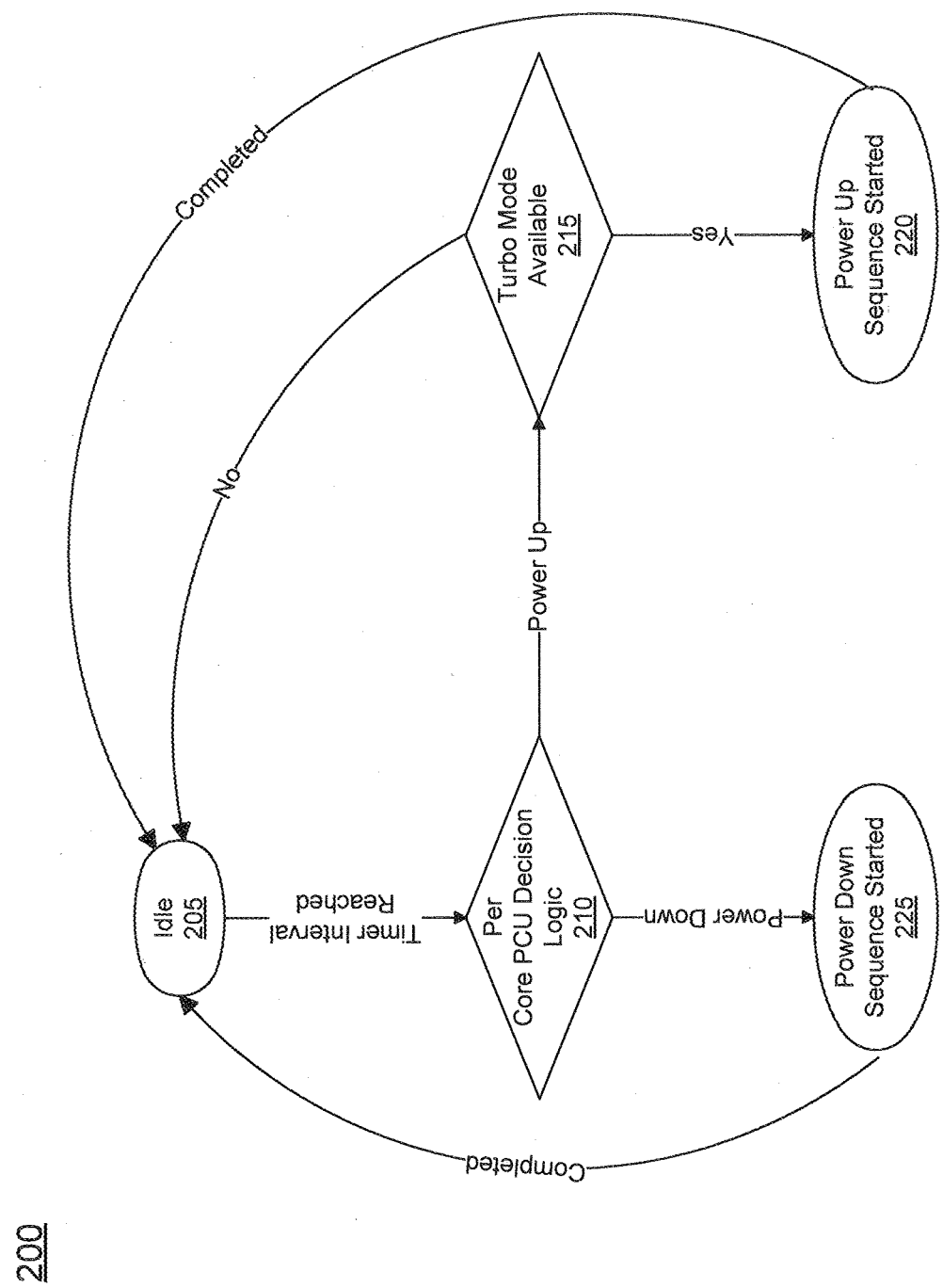
FIG. 2 illustrates a flow chart of a method for architecture event power controller in accordance with one embodiment of the invention.

FIG. 2 illustrates a flow chart of a method 200 for architecture event power controller in accordance with one embodiment of the invention. The method 200 begins when the system is in idle mode 205. When each timer interval is reached, architectural event power optimization logic (AEPOL) examines the counts and decides whether a power up or power down sequence should be initiated 210.

For a power up sequence, AEPOL queries PCU 115 to determine if turbo mode is available 215. If turbo mode is not available, meaning no reserve power is available, AEPOL goes back to idle mode 205 until the next timer interval arrives. If turbo mode is available, AEPOL initiates a power up sequence 220. Once the power up sequence is completed AEPOL goes into idle mode 205 until the next timer interval.

For a power down sequence, AEPOL notifies PCU 115 to initiate power down sequence 225. Once power down sequence is completed, AEPOL goes to idle mode 205 until the next timer interval.

The AEPOL referred to in FIG. 2 is implemented per core. The logic may constantly monitor architectural events to ensure cores are running in it optimal power/performance state.

In one embodiment, architecture event counts of interest are counted and sent to the PCU 115. PCU 115 then analyzes the counts it receives from each counter and determines whether it should power up or power down a particular core 105. In one embodiment, if a system interconnect (shared cache, bus control logic, on-die memory control, etc.) also supports power scaling, the same mechanism may be used to scale system interconnect logic.

In an embodiment, all EMON counters 130 monitored should be referenced together to better understand AEPOL behavior. For example, low instruction retired per cycle (IPC) count does not mean core is not running effectively unless we know it also suffers high cache miss or high branch misprediction.

As shown in Table 1 below, the architecture events of interests are grouped together to make decisions. A threshold count for each architecture event counter is also defined. The threshold value is defined based on performance studies for a particular architecture, as performance may differ depending on the architecture of the system. In Table 1, if all related architecture counters are low, this suggests that the system does not suffer from any system bound actions. Therefore, scaling up the frequency on the core does help increasing the performance of the application. On the other hand, if the core is suffering rather high counts of MLC/LLC misses, there will be no benefit to increase core frequency since the performance is bounded by access latency to an off-chip component. In this situation, the system should scale down the core frequency and divert the saved power to other cores that may be doing useful work.

Therefore, AEPOL allows for an intelligent decision making on when to turn on turbo where performance will benefit and can be observed and it lowers the power dissipation with fine tuning performance power state on cores that are stalling on instruction

TABLE 1

PCU decision tree per core based on architectural event counters

| Architectural Events | Count threshold | Count threshold | Count threshold | Count threshold | Count threshold | Count threshold |
|---|---|---|---|---|---|---|
| Inst. Retired | Low | high | low | low | low | low |
| MLC Miss | low | don't care | high | high | low | low |
| LLC Miss | low | don't care | high | low | don't care | low |
| TLB Miss | low | don't care | don't care | don't care | don't care | high |
| Branch Miss | low | don't care | don't care | don't care | high | don't care |
| Final Decision | Power UP | Powr UP | Power Down | Power Down | Power Up | Power Down |

There can be many more scenarios or other useful architectural event counters that can do finer grain control of the core power usage and the AEPOL logic is applicable to all these situations.

With AEPOL optimization, the system is given a smarter way to utilize the available power to the processor. In future processor design where power aware architecture must exist across the board, AEPOL not only provides a way to conserve energy when it is not needed, it also provides opportunity to optimize performance further within the same power budget. This mechanism opens a whole new range of opportunity for finer grain hardware tuning.

Figure 3:
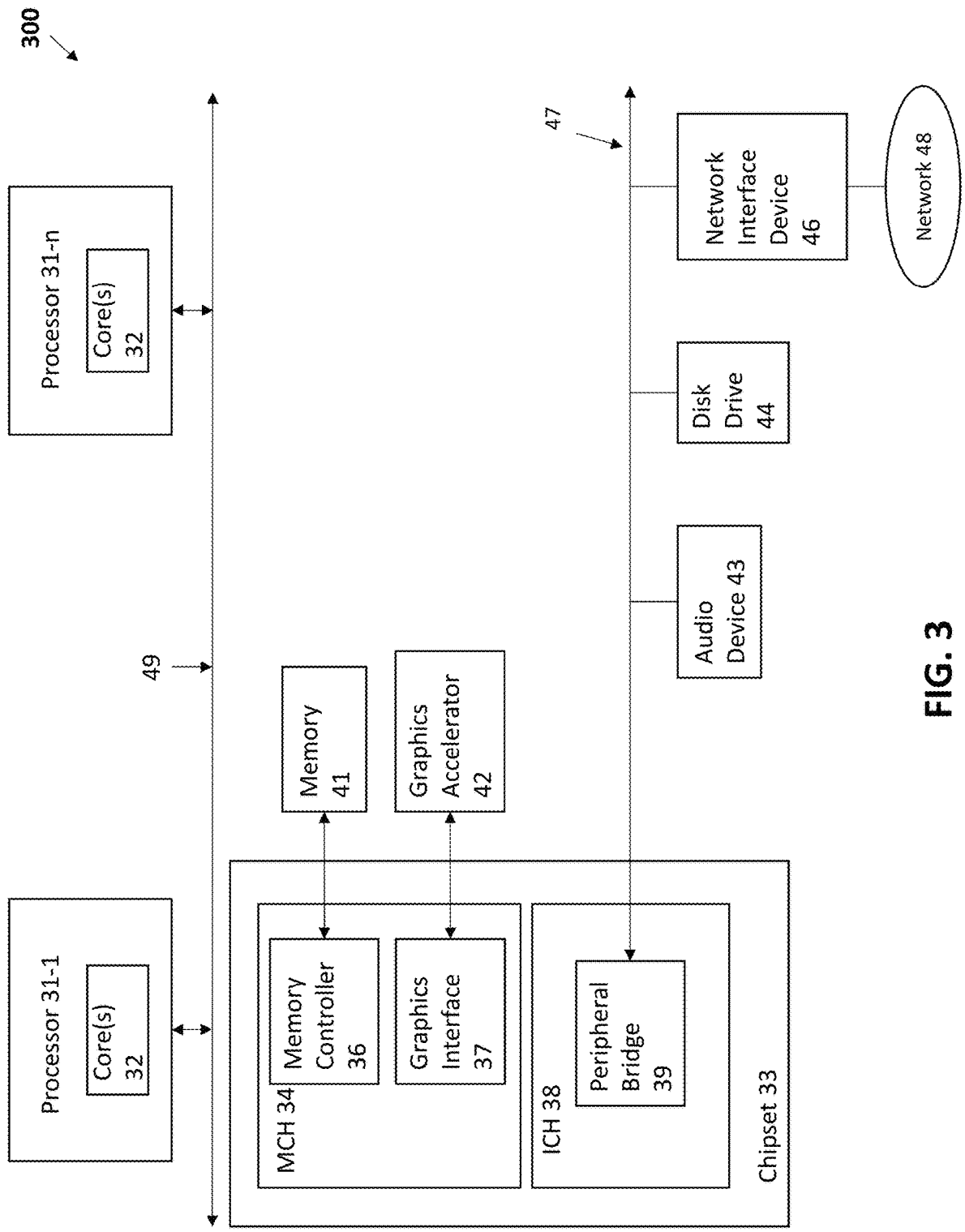
FIG. 3 is a block diagram of computer system in accordance with an embodiment of the invention.

FIG. 3 illustrates a block diagram of a computing system 300 in accordance with an embodiment of the invention. The computing system 300 may include one or more central processing units(s) (CPUs) 31 or processors that communicate via an interconnection network (or bus) 49. The processors 31 may be any type of a processor such as a general purpose processor, a network processor (that processes data communicated over a computer network 48, or other types of a processor (including a reduced instruction set computer (RISC) processor or a complex instruction set computer (CISC). Moreover, the processors 31 may have a single or multiple core design. The processors 31 with a multiple core design may integrate different types of processor cores on the same integrated circuit (IC) die. Also, the processors 31 may utilize the embodiments discussed with references to FIGS. 1 and 2. For example, one or more of the processors 31 may include one or more processor cores 32. Also, the operations discussed with reference to FIGS. 1 and 2 may be performed by one or more components of the system 300.

A chipset 33 may also communicate with the interconnection network 49. The chipset 33 may include a memory control hub (MCH) 34. The MCH 34 may include a memory controller 36 that communicates with a memory 41. The memory 41 may store data and sequences of instructions that are executed by the CPU 31, or any other device included in the computing system 300. In one embodiment of the invention, the memory 41 may include one or more volatile storage (or memory) devices such as random access memory (RAM), dynamic RAM, (DRAM), synchronous DRAM (SDRAM), static RAM (SRAM), or the like. Nonvolatile memory may also be utilized such as a hard disk. Additional devices may communicate via the interconnection network 49, such as multiple CPUs and/or multiple system memories.

The MCH 34 may also include a graphics interface 37 that communicates with a graphics accelerator 42. In one embodiment of the invention, the graphics interface 37 may communicate with the graphics accelerator 42 via an accelerated graphics port (AGP). In an embodiment of the invention, a display (such as a flat panel display) may communicate with the graphics interface 37 through, for example, a signal converter that translates a digital representation of an image stored in a storage device such as a video memory or system memory into display signals that are interpreted and displayed by the display. The display signals produced by the display device may pass through various control devices before being interpreted by and subsequently displayed on the display.

A hub interface 51 may allow the MCH 34 to communicate with an input/output control hub (ICH) 38. The ICH 38 may provide an interface to I/O devices that communicate with components of the computing system 300. The ICH 38 may communicate with a bus 47 through a peripheral bridge (or controller) 39, such as a peripheral component interconnect (PCI) bridge, a universal serial bus (USB) controller, or the like. The bridge 39 may provide a data path between the CPU 31 and peripheral devices. Other types of topologies may be utilized. Also, multiple buses may communicate with the ICH 38, e.g. through multiple bridges or controllers. Moreover, other peripheral in communication with the ICH 38 may include, in various embodiments of the invention, integrated drive electronics (IDE) or small computer system interfaces (SCSI) hard drive(s), USB ports, a keyboard, a mouse, parallel port(s), serial port(s), floppy disk drive(s), digital output support (e.g., digital video interface (DVI)), or the like.

The bus 47 may communicate with an audio device 43, one or more disk drive(s) 44, and a network interface device 46 (which communicates with the computer network 48). Other devices may be in communication with the bus 47. Also, various components (such as the network interface device 46) may be in communication with the MCH 34 in some embodiments of the invention. In addition, the processor 31 and the MCH 34 may be combined to form a single chip. Furthermore, the graphics accelerator 42 may be included within the MCH 34 in other embodiments of the invention.

Furthermore, the computing system 300 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 44) a floppy disk, a compact disk ROM (CD-ROM), a digital versatile disk (DVD), flash memory, a magneto-optical disk, or other types of nonvolatile machine-readable media capable of storing electronic instructions and/or data.

Figure 4:
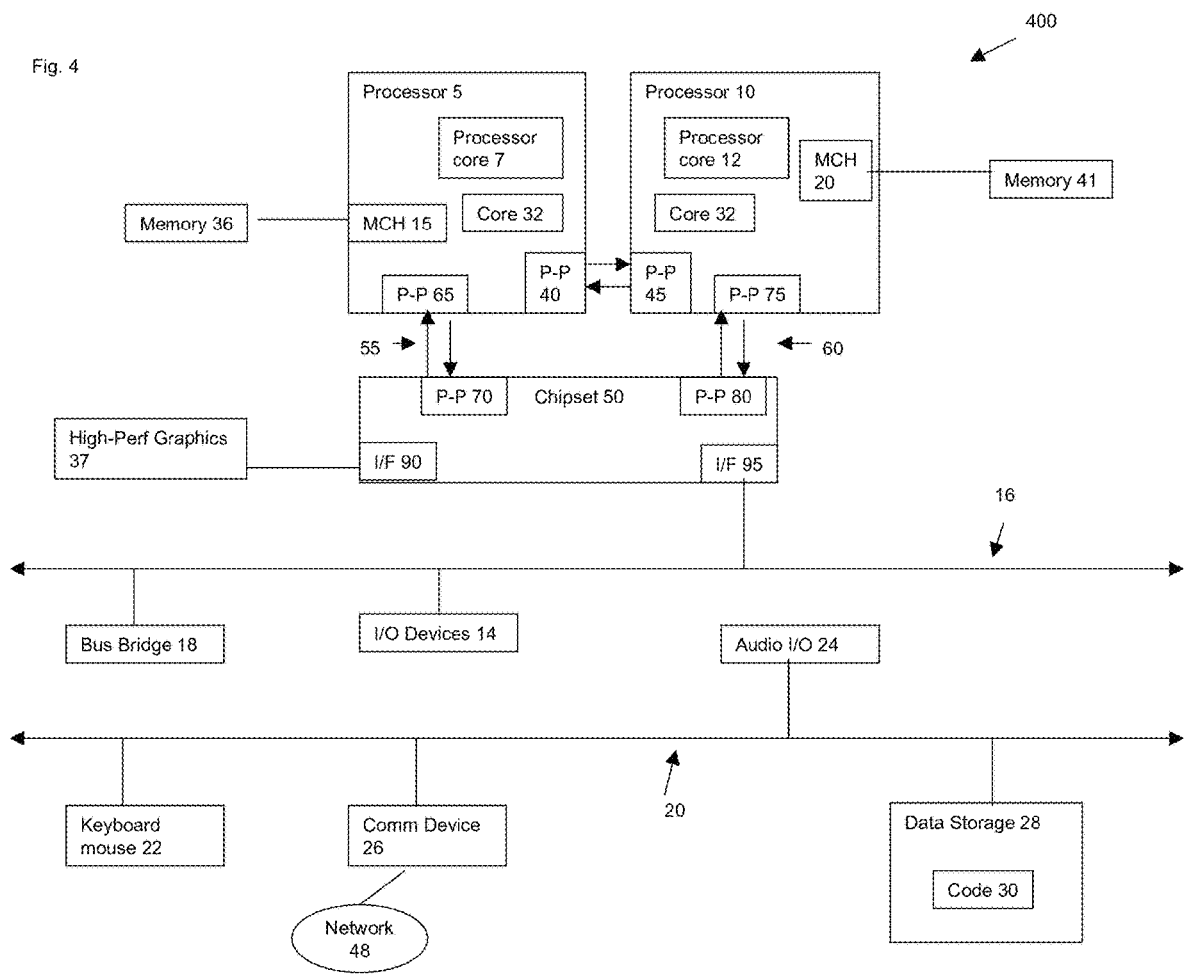
FIG. 4 is a block diagram of a computing system arranged in a point-to-point configuration, according to one embodiment of the invention.

FIG. 4 illustrates a computing system 400 that is arranged in a point-to-point (PtP) configuration, according to an embodiment of the invention. In particular, FIG. 4 shows a system where processors, memory, and input/output devices are interconnected by a number of point to point interfaces. The operations discussed with reference to FIGS. 1-3 may be performed by one or more components of the system 400.

As illustrated in FIG. 4, the system 400 may include several processors, of which only two, processors 5, 10 are shown for clarity. The processors 5, 10 may each include a local memory controller hub (MCH) 15, 20 to allow communication with memories 15, 20. The memories 15, and/or 20 may store various data such as those discussed with reference to the memory 512.

The processors 5, 10 may be any type of a processor such as those discussed with reference to the processors 31 of FIG. 3. The processors 5, 10 may exchange data via a point-to-point interface 93 using PtP interface circuits 40 and 45, respectively. The processors 5, 10 may each exchange data with a chipset 50 via individual PtP interfaces 55, 60 using point to point interface circuits 65, 70, 75, 80. The chipset 50 may also exchange data with a high-performance graphics circuit 37 via a high performance graphic interface 97, using a PtP interface circuit 90.

At least one embodiment of the invention may be provided within the processors 5, 10. For example, one or more of the processor core (s) 32 may be located within the processors 5, 10. Other embodiments of the invention, however, may exist in other circuits, logic units, or devices with the system 400 of FIG. 6. Furthermore, other embodiments of the invention may be distributed throughout several circuits, logic units, or devices illustrated in FIG. 4.

The chipset 50 may communicate with a bus 16 using a PtP interface circuit 95. The bus 16 may have one or more devices that communicate with it, such as a bus bridge 18 and I/O devices 14. Via a bus 20, the bus bridge 14 may be in communication with other devices such as a keyboard/mouse 22, communication devices 26 (such as modems, network interface devices, etc. that may be in communication with the computer network 48), audio I/O devices, and/or a data storage device 28. The data storage device 28 may store code 30 that may be executed by the processors 5 and/or 10.

In various embodiments of the invention, the operations discussed herein, e.g., with reference to FIGS. 1-4 may be implemented by hardware (e.g., circuitry), software, firmware, microcode, or combinations thereof, which may be provided as a computer program product, e.g., including a machine readable or computer readable medium having stored thereon instructions (or software procedures) used to program a computer to perform a process discussed herein. Also, the term "logic" may include, by way of example, software, hardware, or combinations of software and hardware. The machine readable medium may include a storage device such as those discussed with respect to FIGS. 1-4.

Additionally, such computer readable media may be downloaded as a computer program product, wherein the program may be transferred from a remote computer (e.g., a server) to a requesting computer (e.g., client) by way of data signals embodied in a carrier wave or other propagation medium via a communication link (e.g., a bus, a modem, or a network connection). Accordingly, herein, a carrier wave shall be regarded as comprising a machine readable medium.

Reference in the specification to "one embodiment" or "an embodiment" means that a particular feature, structure, or characteristic described in connection with the embodiment is included in at least an implementation. The appearances of the phrase "in one embodiment" in various places in the specification may or may not be all referring to the same embodiment.

Also, in the description and claims, the term "coupled" and "connected", along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

We claim:

1. A system comprising:
a plurality of last level cache (LLC) regions;
a plurality of cores coupled to one or more of the LLC regions, wherein the plurality of LLC regions comprises at least four LLC regions;
a memory interface circuit comprising a memory controller to couple the cores to a dynamic random-access memory;
an accelerator interface to couple one or more of the cores to a graphics accelerator;
wherein a first core of the plurality of cores comprises:
a plurality of thermal sensors to collect thermal data for the first core, and
a plurality of performance counters to count architectural events within the first core, including counters to count completed instructions, cache-related misses, and branch misses; and
a power management unit to manage power usage on a per core basis based on at least one of available power, the thermal data from the plurality of thermal sensors, and the architectural events counted by the performance counters, and to scale up a first frequency of the first core when the architectural events indicate performance of the core is below a system bound and to enter a turbo mode for the first core based on the available power, wherein values of the performance counters are compared to respective thresholds to manage the power usage, and wherein below the system bound is indicated by the completed instruction count being below its threshold, the cache-related misses being below its threshold, and the branch miss count being above its threshold.

2. The system as in claim 1 wherein the plurality of cores comprise at least eight cores.

3. The system as in claim 1 wherein the graphics accelerator is coupled to one or more of the plurality of cores over an interconnect.

4. The system as in claim 1 further comprising:
at least one communication device coupled to one or more of the plurality of cores.

5. The system as in claim 1 further comprising:
at least one storage device coupled to one or more of the plurality of cores.

6. The system as in claim 1 further comprising:
the graphics accelerator coupled to the one or more of the plurality of cores.

7. The system as in claim 6 further comprising:
a display coupled to the graphics accelerator through a graphics interface.

8. The system as in claim 7 further comprising:
a signal converter that translates a digital representation of an image stored in a storage device into display signals that are interpreted and displayed by the display.

9. The system as in claim 6 further comprising a video memory usable by the graphics accelerator.

10. The system as in claim 1 further comprising:
a user input device coupled to one or more of the plurality of cores over an interconnect.

11. The system as in claim 1 further comprising:
an audio device coupled to one or more of the plurality of cores.

12. The system as in claim 1, wherein the dynamic random-access memory comprises a plurality of dynamic random-access memory devices, and each dynamic random-access memory device coupled to a core of the plurality of cores.

13. The system as in claim 1, wherein values of performance counters are compared to respective thresholds to manage the power usage.

14. The system as in claim 1, wherein the power management unit is to scale up the first frequency of the first core and scale down a second frequency of a second core to allocate saved power to the first core.

\* \* \* \* \*